(12) United States Patent
Ok (10) Patent No.: US 8,441,871 B2
(45) Date of Patent: May 14, 2013

(54) RINGBACK CIRCUIT FOR SEMICONDUCTOR MEMORY DEVICE

(75) Inventor: Sung-Hwa Ok, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 139 days.

(21) Appl. No.: 12/980,677

(22) Filed: Dec. 29, 2010

(65) Prior Publication Data

US 2012/0106275 A1   May 3, 2012

(30) Foreign Application Priority Data

Oct. 29, 2010 (KR) .................. 10-2010-0106825

(51) Int. Cl.
*G11C 7/00* (2006.01)

(52) U.S. Cl.
USPC .......................... 365/193; 365/194

(58) Field of Classification Search .......... 365/193, 365/194
See application file for complete search history.

(56) References Cited

U.S. PATENT DOCUMENTS 7,729,198 B2 * 6/2010 Hasegawa et al. ........ 365/233.18
7,839,705 B2 * 11/2010 Park ............................. 365/193
8,027,205 B2 * 9/2011 Choi ........................ 365/189.05

FOREIGN PATENT DOCUMENTS

| KR | 1020040093858 | 11/2004 |
| KR | 100902126 | 6/2009 |
| KR | 1020090067795 | 6/2009 |

OTHER PUBLICATIONS

Notice of Allowance issued by the Korean Intellectual Property Office on Dec. 28, 2011.

* cited by examiner

*Primary Examiner* — Son Dinh
*Assistant Examiner* — Nam Nguyen
(74) *Attorney, Agent, or Firm* — IP & T Group LLP

(57) ABSTRACT

A circuit for a semiconductor memory device includes: a filtering control signal generation unit configured to synchronize a seed signal activated in a pre-amble period of a data strobe signal with the data strobe signal and sequentially generate a plurality of filtering control signals in response to the seed signal; and a filtering signal output unit configured to generate a filtering signal for filtering the data strobe signal in response to the plurality of filtering control signals and a plurality of burst length (BL) control signals.

19 Claims, 7 Drawing Sheets

RINGBACK CIRCUIT FOR SEMICONDUCTOR MEMORY DEVICE

CROSS-REFERENCE TO RELATED APPLICATIONS

The present application claims priority of Korean Patent Application No. 10-2010-0106825, filed on Oct, 29, 2010, which is incorporated herein by reference in its entirety.

BACKGROUND OF THE INVENTION

Exemplary embodiments of the present invention relate to a semiconductor design technology, and more particularly, to a ringback circuit for a semiconductor memory device.

A semiconductor memory device including DRAM may receive write data from a chip set (memory controller). Here, both of the semiconductor memory device and the chip set are synchronized and operated by a system clock signal. When data is transferred to the semiconductor memory device from the chip set, the load on and trace of the data signal are different from those of the system clock signal, and a skew (e.g., a phase difference) occurs between the data and the system clock signal due to spatial differences in transferring the system clock signal to a plurality of memories.

In order to reduce the skew between the data and the system clock signal, a data strobe signal DQS is transferred together when the data is transferred to the semiconductor memory device. The data strobe signal DQS is called an echo clock signal, and has the same load and trace as the data. Therefore, when the semiconductor memory device strobes the data by using the data strobe signal DQS, the skew between the system clock signal and the data may be minimized.

Here, the data strobe signal DQS may toggle, for example, only in a predetermined period. When the toggling data strobe signal DQS returns to a high impedance (Hi-Z) state after a final clock edge, ringing often occurs. Such a phenomenon is referred to as write post-amble ringing. In other words, after the toggling of the data strobe signal DQS ends, a glitch occurs in the data strobe signal DQS due to noise. The write post-amble ringing may occur due to the characteristic of a transfer line during the transferring process of the data strobe signal or the characteristic of a buffer for interfacing the data strobe signal.

In order to prevent the write post-amble ringing, the semiconductor memory device includes a ringback circuit.

Figure 1:
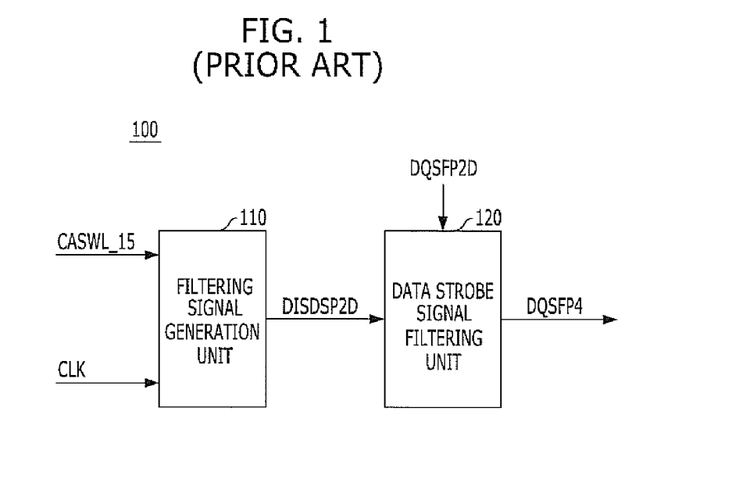
FIG. 1 is a block configuration diagram illustrating a ringback circuit of a conventional semiconductor memory device.

FIG. 1 is a block configuration diagram illustrating a ringback circuit of a conventional semiconductor memory device.

Referring to FIG. 1, the ringback circuit 100 includes a filtering signal generation unit 110 and a data strobe signal filtering unit 120.

The filtering signal generation unit 110 is configured to receive a clock signal CLK and a write delay signal CASWL_15 obtained by delaying a write command by a desired period and generate a filtering signal DISDSP2D for filtering a data strobe signal DQS, The write command is not illustrated in FIG. 1. The strobe signal filtering unit 120 is configured to limit the toggling period of a data strobe falling pulse DQSFP2D in response to the filtering signal DISDSP2D. Here, the data strobe falling pulse DQSFP2D is a signal which is derived from the data strobe signal DQS and pulses in correspondence to a falling edge of the data strobe signal DQS.

Figure 2:
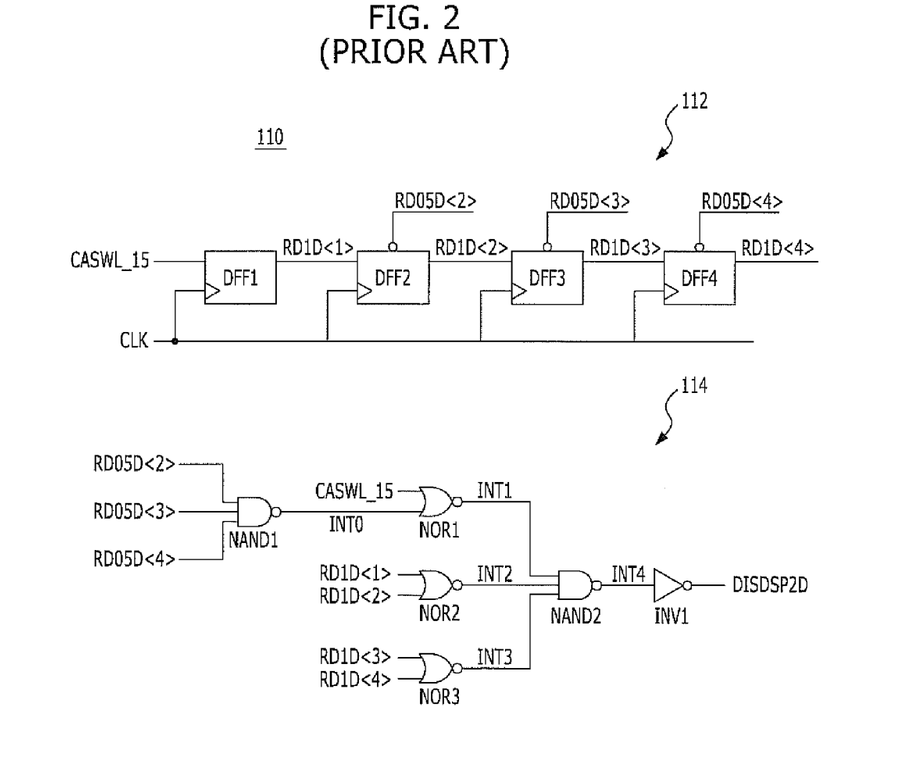
FIG. 2 is an internal circuit diagram of a filtering signal generation unit of FIG. 1.

FIG. 2 is an internal circuit diagram of the filtering signal generation unit 110 of FIG. 1.

Referring to FIG. 2, the filtering signal generation unit 110 includes a clock synchronization signal generation section 112 and a filtering signal output section 114. The clock synchronization signal generation section 112 is configured to synchronize the write delay signal CASWL_15 with the clock signal CLK and sequentially generate first to fourth rising edge synchronization signals RD1D<1> to RD1D<4> and first to third falling edge synchronization signals RD05D<2> to RD05D<4>. The filtering signal output section 114 is configured to logically combine the first to fourth rising edge synchronization edge signals RD1D<1> to RD1D<4>, the first to third falling edge synchronization signals RD05D<2> to RD05D<4>, and the write delay signal CASWL_15 and output the filtering signal DISDSP2D.

The clock synchronization signal generation section 112 includes first to fourth D flip-flops DFF1 to DFF4 configured to synchronize the respective input signals with the clock signal CLK.

The filtering signal output section 114 includes a first NAND gate NAND1, a first NOR gate NOR1, a second NOR gate NOR2, a third NOR gate NOR3, a second NAND gate NAND2, and a first inverter INV1. The first NAND gate NAND1 is configured to receive the first to third falling edge synchronization signals RD05D<2> to RD05D<4> and perform a NAND operation on the received signals. The first NOR gate NOR1 is configured to receive an output signal INT0 of the first NAND gate NAND1 and the write delay signal CASWL_15 and perform a NOR operation on the received signals. The second NOR gate NOR2 is configured to receive the first and second rising edge synchronization signals RD1D<1> and RD1D<2> and perform a NOR operation on the received signals. The third NOR gate NOR3 is configured to receive the third and fourth rising edge synchronization signals RD1D<3> and RD1D<4> and perform a NOR operation on the received signals. The second NAND gate NAND2 is configured to receive output signals INT1 to INT3 of the first to third NOR gates NOR1 to NOR3 and perform a NAND operation on the received signals. The first inverter INV1 is configured to invert an output signal INT4 of the second NAND gate NAND2 and output the filtering signal DISDSP2D.

Hereafter, the operation of the ringback circuit 100 of the conventional semiconductor memory device will be described with reference to FIG. 3.

Figure 3:
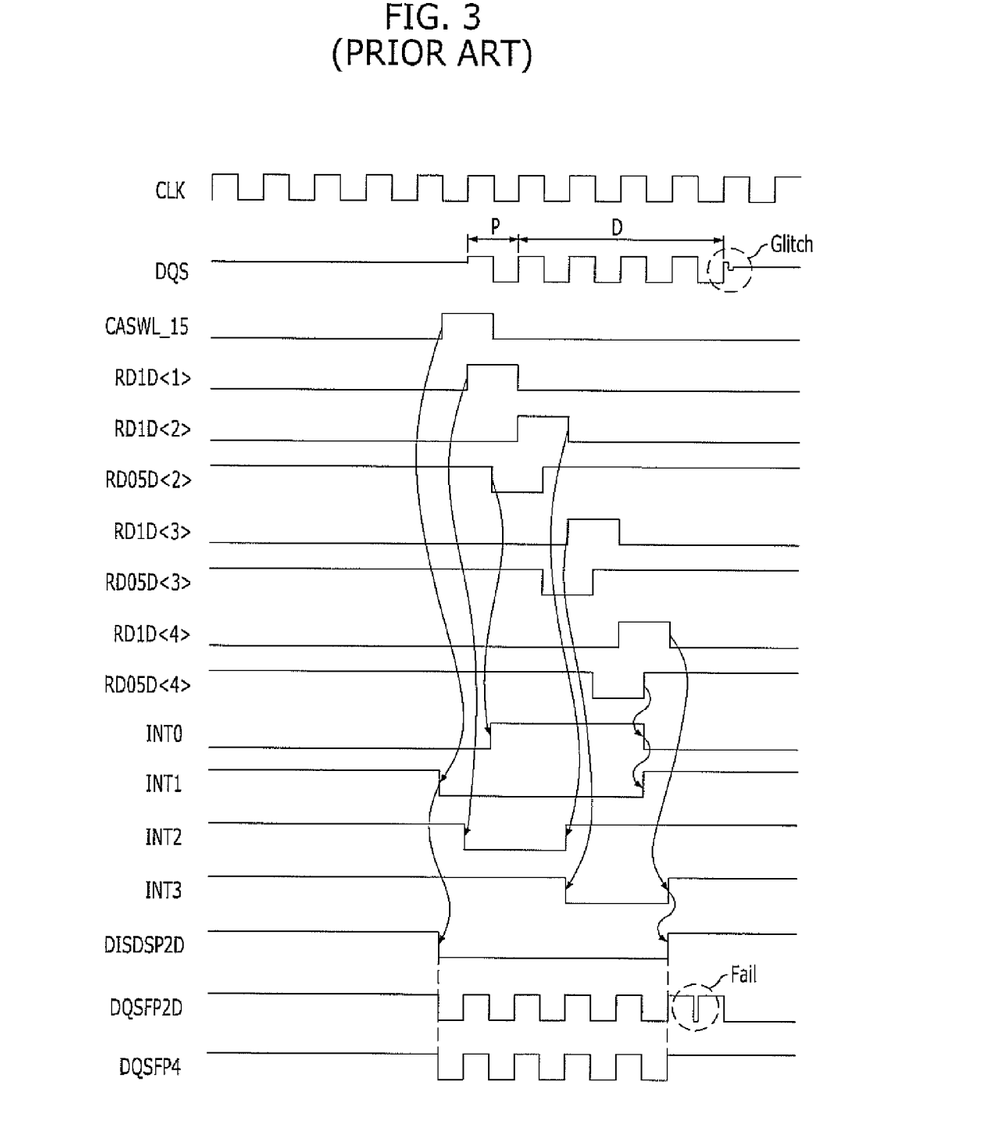
FIG. 3 is a timing diagram explaining the operation of the ringback circuit of the conventional semiconductor memory device of FIG. 1.

FIG. 3 is a timing diagram explaining the operation of the ringback circuit of the conventional semiconductor memory device of FIG. 1.

In FIG. 3, the data strobe signal DQS includes a pre-amble period P in which the data strobe signal DQS previously starts toggling from a desired time point in a high impedance (Hi-Z) state, a period D for substantially outputting data after the preamble period P, and a post-amble period in which the data strobe signal DQS returns to the high-impedance state. Here, it can be seen that a glitch occurs in the data strobe signal DQS, when the toggling data strobe signal DQS returns to the high impedance state after a final falling edge, that is, during the post-amble period. Such a glitch which may cause a fail during the data output, may be filtered out. The filtering method will be described below.

First, the filtering signal generation unit 110 generates a filtering signal DISDSP2D for filtering a data strobe falling pulse DQSFP2D corresponding to a falling edge of the data strobe signal DQS. The filtering signal DISDSP2D is a signal for filtering the entire period of the data strobe signal DQS excluding the period D required for data output, and has a pulse width corresponding to the period D required for data output in the data strobe signal DQS.

In response to the filtering signal DISDSP2D, the data strobe signal filtering unit 120 filters the data strobe falling pulse DQSFP2D and outputs the filtered data strobe signal DQSFP4. If the data strobe falling pulse DQSFP2D is used without being filtered, undesired data is outputted by a final rising edge of the data strobe falling pulse DQSFP2D, that is, a pulse corresponding to a glitch occurring in the data strobe signal DQS.

According to the ringback circuit 100 of the semiconductor memory device, a fail caused by a glitch occurring in the data strobe signal DQS, when data is outputted, may be substantially prevented.

However, the ringback circuit 100 of the conventional semiconductor memory device also has the following features.

The filtering signal DISDSP2D for filtering the data strobe signal DQS is generated in the clock signal domain. That is, the filtering signal DISDSP2D is generated by a combination of the first to fourth rising edge synchronization signals RD1D<1> to RD1D<4> in synchronism with the clock signal CLK and the first to third falling edge synchronization signals RD05D<2> to RD05D<4>. Here, since the domain of the clock signal CLK is different from the domain of the data strobe signal DQS, a skew (e.g., a phase difference or misalignment of clock edges compared to edges of the data strobe signal DQS) may occur between the filtering signal DISDSP2D generated in the clock signal domain and the data strobe falling pulse DQSFP2D generated in the data strobe signal domain. In this case, since the data strobe falling pulse DQSFP2D may not be accurately filtered, a post-amble ringing may occur.

Here, a domain crossing margin tDQSS between the data strobe signal DQS and the clock signal CLK is often specified in specifications. Semiconductor memory devices are to support the pre-amble period of the data strobe signal DQS in a high-speed operation, where the pre-amble period of the data strobe signal DQS is variously supported and to accommodate the variously supported pre-amble periods of the data strobe signal DQS, various domain crossing margins tDQSS are used. Therefore, since the domain crossing margin tDQSS between the data strobe signal DQS and the clock signal CLK should satisfy the specification, the domain crossing margin tDQSS between the filtering signal DISDSP2D and the data strobe signal DQS is also limited. A ringback circuit which supports various preamble period schemes for the data strobe signal DQS is useful.

SUMMARY OF THE INVENTION

An embodiment of the present invention is directed to a ringback circuit for a semiconductor memory apparatus, which is capable of preventing a write post-amble ringing phenomenon of a data strobe signal DQS without being limited to a domain crossing margin tDQSS.

In accordance with an embodiment of the present invention, a circuit for a semiconductor memory device includes: a filtering control signal generation unit configured to synchronize a seed signal activated in a pre-amble period of a data strobe signal with the data strobe signal and sequentially generate a plurality of filtering control signals in response to the seed signal; and a filtering signal output unit configured to generate a filtering signal for filtering the data strobe signal in response to the plurality of filtering control signals and a plurality of burst length (BL) control signals.

In accordance with another embodiment of the present invention, a circuit for a semiconductor memory device includes: a seed signal generation unit configured to generate a seed signal in a pre-amble period of a data strobe signal; a filtering control signal generation unit configured to synchronize the seed signal with the data strobe signal and sequentially generate filtering control signals; a filtering signal output unit configured to generate a filtering signal in response to the filtering control signals and first and second burst length (BL) control signals; and a data strobe signal filtering unit configured to filter and output the data strobe signal according to the filtering signal.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 4:
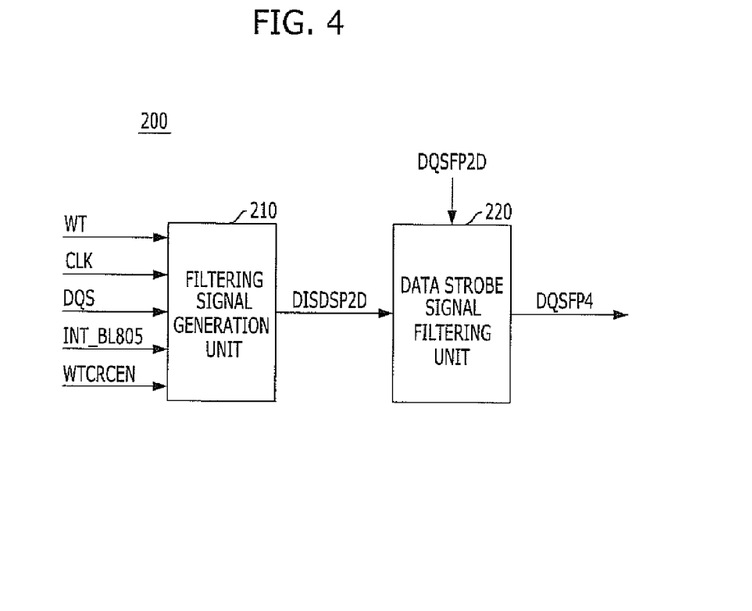
FIG. 4 is a block configuration diagram of a ringback circuit of a semiconductor memory in accordance with an embodiment of the present invention.

FIG. 4 is a block configuration diagram of a ringback circuit of a semiconductor memory in accordance with an embodiment of the present invention.

Referring to FIG. 4, the ringback circuit 200 of the semiconductor memory device includes a filtering signal generation unit 210 and a strobe signal filtering unit 220. The filtering signal generation unit 210 is configured to receive a write command WT, a data strobe signal DQS, and first and second burst length (BL) control signal INT_BL805 and WTCRCEN, and generate a filtering signal DISDSP2D. The data strobe signal filtering unit 220 is configured to filter a data strobe falling pulse DQSFP2D according to the filtering signal DISDSP2D and output the filtered data strobe signal DQSFP4. The data strobe falling pulse DQSFP2D is a signal having a pulse corresponding to a falling edge of the data strobe signal DQS.

Here, the first BL control signal INT_BL805 is a signal for controlling a BL to 'BC(burst chop)4' or 'BL8', and the second BL control signal WTCRCEN is a signal for controlling the BL to 'BL10'. In particular, a signal representing cyclic redundancy check (CRC) use/nonuse information is used as the second BL control signal WTCRCEN. The first and second BL control signals INT_BL805 and WTCRCEN may be directly provided by a mode register set (MRS) or provided as a signal generated by logically combining signals provided by the MRS.

Figure 5:
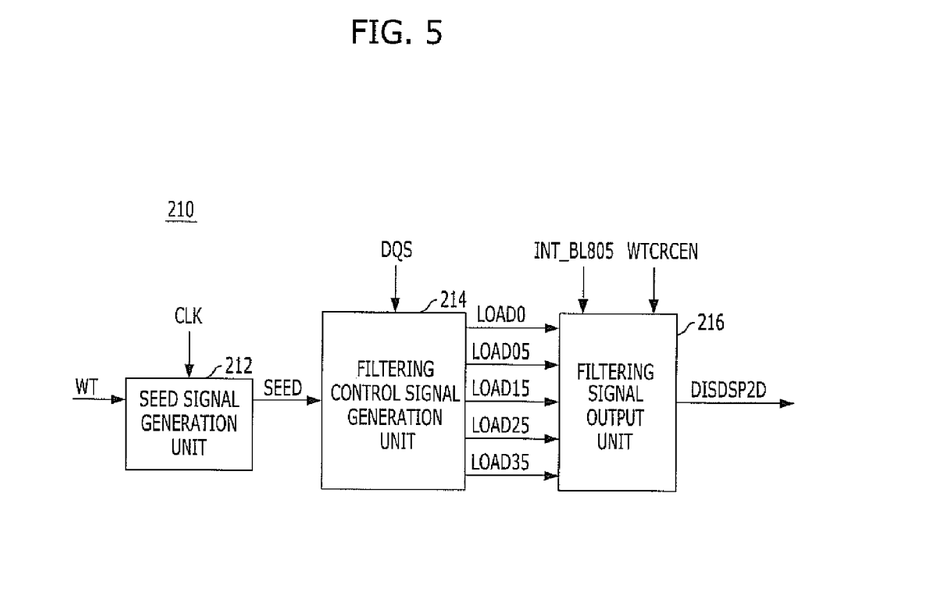
FIG. 5 is a block configuration diagram of a filtering signal generation unit of FIG. 4.
Figure 6A:
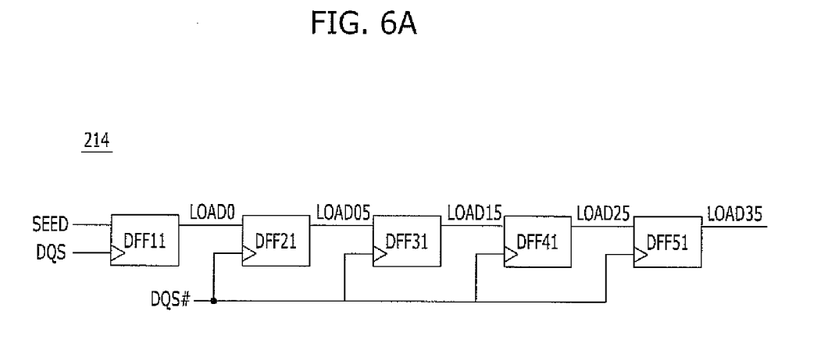
FIG. 6A is an internal circuit diagram of a filtering control signal generation section of FIG. 5.
Figure 6B:
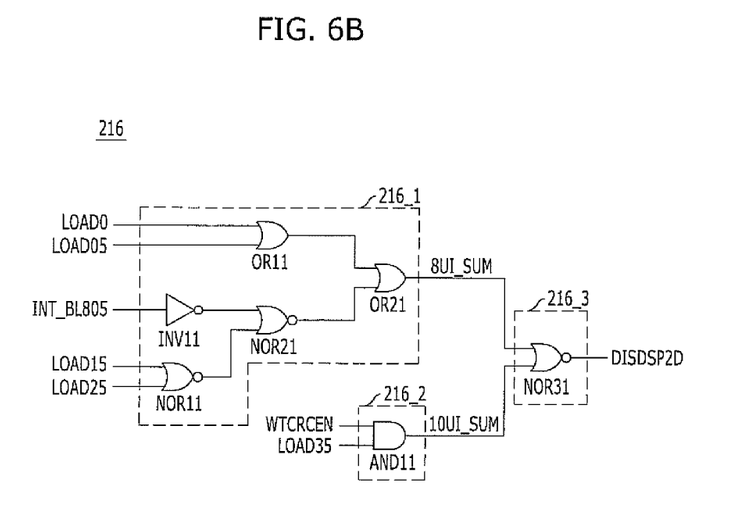
FIG. 6B is an internal circuit diagram of a filtering signal output unit of FIG. 5.

FIG. 5 is a block configuration diagram of the filtering signal generation unit 210 of FIG. 4. FIG. 6A is an internal circuit diagram of a filtering control signal generation unit 214 of FIG. 5, and FIG. 6B is an internal circuit diagram of a filtering signal output unit 216 of FIG. 5.

Referring to FIG. 5, the filtering signal generation unit 210 includes a seed signal generation unit 212, a filtering control signal generation unit 214, and a filtering signal output unit 216. The seed signal generation unit 212 is configured to output a seed signal SEED which is activated at a pre-amble period of the data strobe signal DQS in response to a write command WT. The filtering control signal generation unit 214 is configured to synchronize the seed signal SEED with the data strobe signal DQS and sequentially generate first to fifth filtering control signals LOAD0, LOAD05, LOAD15, LOAD25, and LOAD35. The filtering signal output unit 216 is configured to generate the filtering signal DISDSP2D in response to the first to fifth filtering control signals LOAD0, LOAD05, LOAD15, LOAD25, and LOAD35 and the first and second BL control signal INT_BL805 and WTCRCEN.

The seed signal generation unit 212 generates the seed signal SEED by delaying the write command WT by a desired period. At this time, the seed signal generation 212 synchronizes the seed signal SEED with a clock signal CLK, which may have a skew (e.g., a phase difference as described above) with respect to the data strobe signal DQS. For example, when the pre-amble period of the data strobe signal DQS is 1tCK, the seed signal generation unit 212 activates the seed signal SEED at a clock edge corresponding to 0.5tCK in the pre-amble period of the data strobe signal DQS, and when the pre-amble period of the data strobe signal DQS is 2tCK, the seed signal generation unit 212 generates the seed signal SEED at a clock edge corresponding to 1tCK in the pre-amble period of the data strobe signal DQS. The seed signal generation unit 212 may include a D flip-flop.

Referring to FIG. 6A, the filtering control signal generation unit 214 includes first to fifth D flip-flops DFF11 to DFF51. The first flip-flop DFF11 is configured to receive the seed signal SEED and output the first filtering control signal LOAD0 in synchronization with a rising edge of the data strobe signal DQS. The second flip-flop DFF21 is configured to receive the first filtering control signal LOAD0 and output the second filtering control signal LOAD05 in synchronization with a rising edge of a data strobe bar signal DQS# which is an inverted signal of the data strobe signal DQS. The third D flip-flop DFF31 is configured to receive the second filtering control signal LOAD05 and output the third filtering control signal LOAD15 in synchronization with a rising edge of the data strobe bar signal DQS#. The fourth D flip-flop DFF41 is configured to receive the third filtering control signal LOAD15 and output the fourth filtering control signal LOAD25 in synchronization with a rising edge of the data strobe bar signal DQS#. The fifth D flip-flop DFF51 is configured to receive the fourth filtering control signal LOAD35 and output the fifth filtering control signal LOAD35 in synchronization with a rising edge of the data strobe bar signal DQS#. In other words, the first D flip-flop DFF11 outputs the input signal in synchronization with a rising edge of the data strobe signal DQS, and the second to fifth D flip-flops DFF21 to 51 output the respective input signals in synchronization with a falling edge of the data strobe signal DQS (that is, an edge corresponding to a rising edge of the data strobe bar signal DQS#).

Referring to FIG. 6B, the filtering signal output unit 216 includes a first activation signal generator 216_1, a second activation signal generator 216_2, and an output section 216_3. The first activation signal generator 216_1 is configured to generate a first activation signal 8UI_SUM according to the first to fourth filtering control signals LOAD0, LOAD05, LOAD15, and LOAD25. The second activation signal generator 216_2 is configured to generate a second activation signal 10UI_SUM according to the fifth filtering control signal LOAD35 and the second BL control signal WTCRCEN. The output section 216_3 is configured to generate the filtering signal DISDSP2D according to the first and second activation signals 8UI_SUM and 10UI_SUM.

The first activation signal generator 216_1 includes a first OR gate OR11, a first inverter INV11, a first NOR gate NOR11, a second NOR gate 21, and a second OR gate OR21. The first OR gate OR11 is configured to receive the first and second filtering control signals LOAD0 and LOAD05 and perform an OR operation on the received signals. The first inverter INV11 is configured to invert the first BL control signal INT_BL805. The first NOR gate NOR11 is configured to receive the third and fourth filtering control signals LOAD15 and LOAD25 and perform a NOR operation on the received signals. The second NOR gate NOR 21 is configured to receive an output signal of the first inverter INV11 and an output signal of the first NOR gate NOR11 and perform a NOR operation on the received signals. The second OR gate OR21 is configured to receive an output signal of the first OR gate OR11 and an output signal of the second NOR gate NOR21 and perform an OR operation on the received signals.

The second activation signal generator 216_2 includes a first AND gate AND11 configured to receive the second BL control signal WTCRCEN and the fifth filtering control signal LOAD35 and perform an AND operation on the received signals.

The output section 216_3 includes a third NOR gate NOR31 configured to receive the output signal 8UI_SUM of the second OR gate 21 and the output signal 10UI_SUM of the first AND gate AND11 and perform a NOR operation on the received signals.

Hereafter, the operation of the ringback circuit 200 of the semiconductor memory device in accordance with the embodiment of the present invention will be described with reference to FIGS. 7 to 9.

Figure 7:
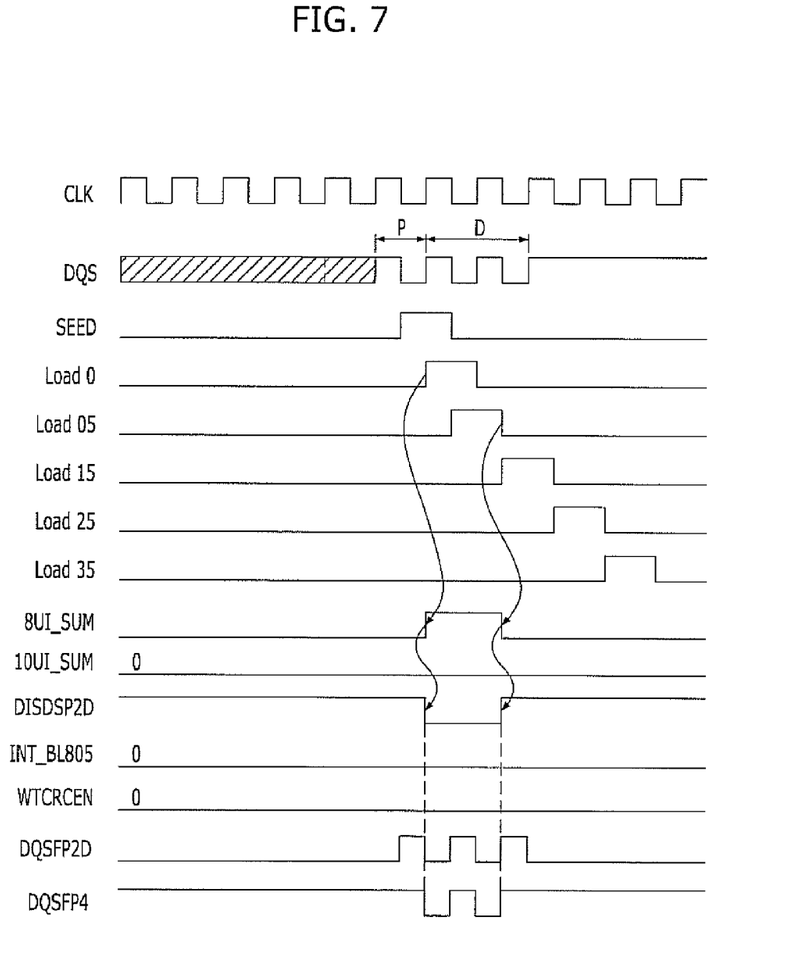
FIGS. 7 to 9 are timing diagrams explaining the operation of the ringback circuit of FIG. 4 depending on each BL.

FIG. 7 is a timing diagram explaining the operation of the ringback circuit 200 according to a case in which the BL is 'BC4'. FIG. 8 is a timing diagram explaining the operation of the ringback circuit 200 according to a case in which the BL is 'BL8'. FIG. 9 is a timing diagram explaining the operation of the ringback circuit 200 according to a case in which the BL is 'BC10'.

In FIG. 7, the data strobe signal DQS includes a pre-amble period P in which the data strobe signal DQS starts toggling from being in a high-impedance (Hi-Z) state, a toggling period D required for data output, and a post-amble period in which the data strobe signal DQS returns to the high impedance state after the toggling period D for outputting data output. At this time, the ringback circuit 200 synchronizes the seed signal SEED signal activated in the pre-amble period P of the data strobe signal DQS with the data strobe signal DQS and sequentially generates the first to fifth filtering control signals LOAD0, LOAD05, LOAD15, LOAD25, and LOAD35. That is, the first filtering control signal LOAD0 is generated in synchronization with a rising edge of the data strobe signal DQS, and the second to fifth filtering control signals LOAD05, LOAD15, LOAD25, and LOAD35 are sequentially generated in synchronization with falling edges of the data strobe signal DQS. Referring to FIG. 7, the first to fifth filtering control signals LOAD0, LOAD05, LOAD15, LOAD25, and LOAD35 are generated in the data strobe signal domain. Hereafter, a subsequent operation of the ringback circuit 200 depending on each BL will be described on the basis of the above-described operation process.

Referring to FIG. 7, the first and second BL control signals INT_BL805 and WTCRCEN are deactivated to a logic low level according to the BL of BC4, and the second activation signal 10UI_SUM is deactivated to a logic low level as the second BL control signal WTCRCEN is deactivated. Accordingly, the filtering signal output unit 216 outputs only the first activation signal 8UI_SUM corresponding to a logical combination of the first and second filtering control signals LOAD0 and LOAD05, as the filtering signal DISDSP2D. Then, the data strobe signal filtering unit 220 filters a data strobe falling pulse DQSFP2D, which pulses in correspondence to a falling edge of the data strobe signal DQS, according to the filtering signal DISDSP2D, and outputs the filtered data strobe signal DQSFP4. At this time, the filtered data strobe signal DQSFP4 has a toggling period for outputting 4-bits of data and the rest of the filter data strobe signal DQSFP4 outside the toggling period for outputting 4-bits of data is filtered.

Figure 8:
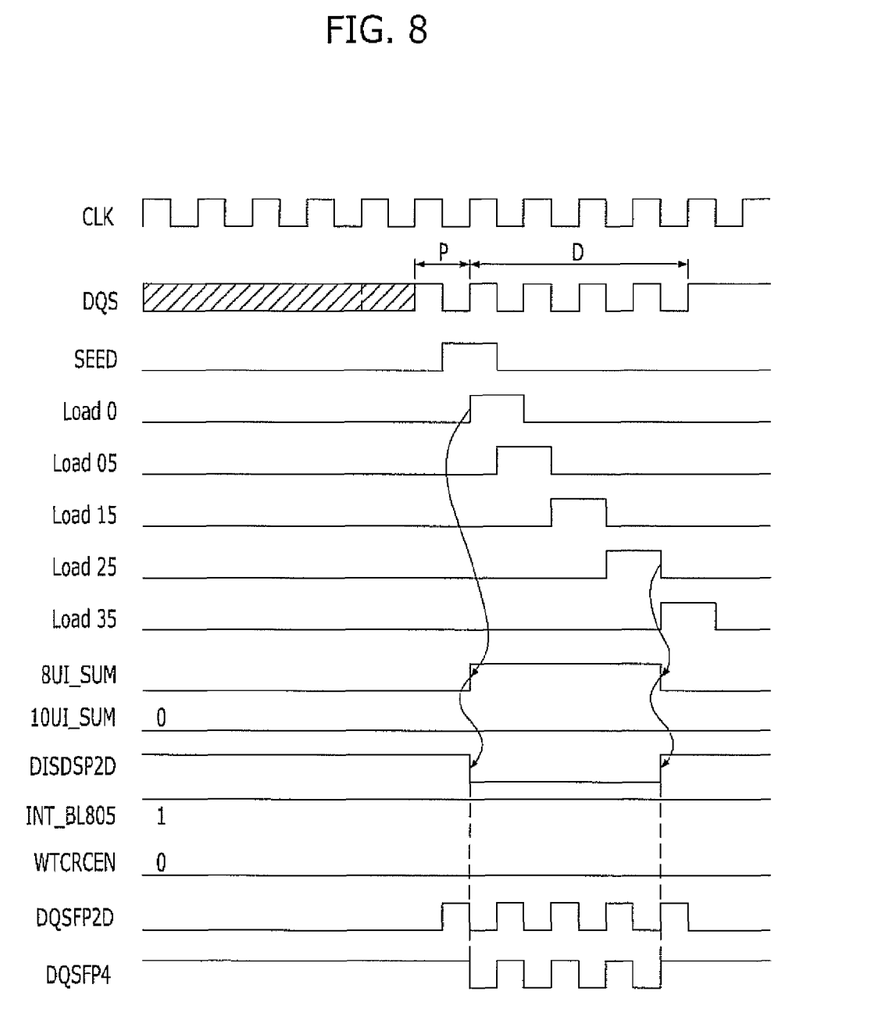

Referring to FIG. 8, the first BL control signal INT_BL805 is activated to a logic high level, and the second BL control signal WTCRCEN is deactivated to a logic low level, according to the BL of 'BL8' for outputting 8 bits of data. As the second BL control signal WTCRCEN is deactivated, the second activation signal 10UI_SUM is deactivated to a logic low level. Accordingly, the filtering signal output unit 216 outputs only the first activation signal 8UI_SUM corresponding to a logical combination of the first to fourth filtering control signals LOAD0, LOAD05, LOAD15, and LOAD25 as the filtering signal DISDSP2D. Then, the data strobe signal filtering unit 220 filters the data strobe falling pulse DQSFP2D according to the filtering signal DISDSP2D and outputs the filtered data strobe signal DQSFP4. At this time, it can be seen that the filtered data strobe signal DQSFP4 has a toggling period for outputting 8-bit data, and the rest period excluding the toggling period for outputting 8-bit data is filtered.

Figure 9:
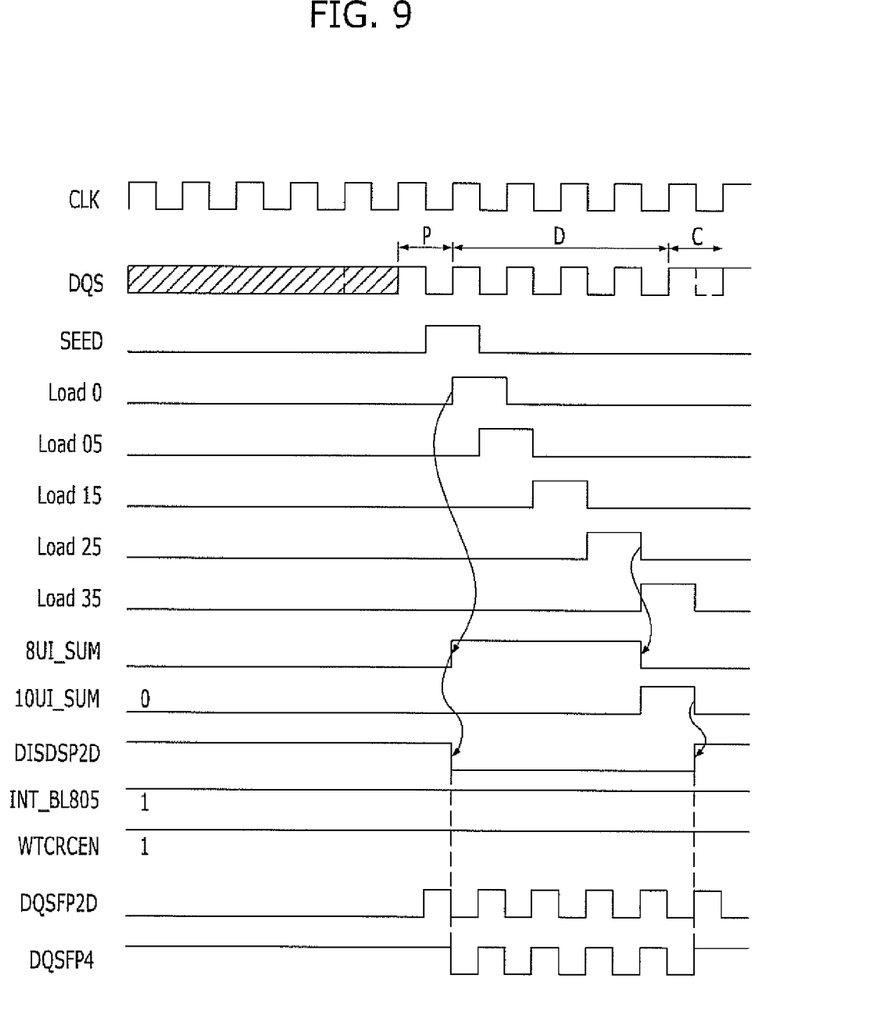

Referring to FIG. 9, both of the first and second BL control signals INT_BL805 and WTCRCEN are activated to a logic high level according to the BL of 'BL10' for outputting 10 bits of data, and the second activation signal 10UI_SUM is activated to a logic high level as the second BL control signal WTCRCEN is activated. Accordingly, the filtering signal output unit 216 outputs the filtering signal DISDSP2D corresponding to a logical combination of the first activation signal 8UI_SUM corresponding to a logical combination of the first to fourth filtering control signals LOAD0, LOAD05, LOAD15, and LOAD25 and the second activation signal 10UI_SUM corresponding to the fifth filtering control signal LOAD35. Then, the data strobe signal filtering unit 220 filters the data strobe falling pulse DQSFP2D according to the filtering signal DISDSP2D, and outputs the filtered data strobe signal DQSFP4. At this time, it can seen that the filtered data strobe signal DQSFP4 has a toggling period for outputting 10-bit data, and the rest of the filtered data strobe signal DQSFP4 other than the toggling period for outputting 10-bit data is filtered out.

In accordance with the embodiment of the present invention, since the filtering signal DISDSP2D and the data strobe falling pulse DQSFP2D are generated in the data strobe signal domain, the domain crossing margin tDQSS is not needed to be added between the filtering signal DISDSP2D and the data strobe falling pulse DQSFP2D. The ringback circuit in accordance with the embodiment of the present invention may be easily applied to memory devices which supports various pre-amble schemes for the data strobe signal DQS in various ways. Furthermore, since a skew does not occur between the filtering signal DISDSP2D and the data strobe falling pulse DQSFP2D, a write post-amble ringing phenomenon may be prevented.

While the present invention has been described with respect to the specific embodiments, it will be apparent to those skilled in the art that various changes and modifications may be made without departing from the spirit and scope of the invention as defined in the following claims.

What is claimed is:

1. A ringback circuit for a semiconductor memory device, comprising:
   a filtering control signal generation unit configured to receive data strobe signal and synchronize a seed signal activated in a pre-amble period of the data strobe signal with the data strobe signal and sequentially generate a plurality of filtering control signals in response to the seed signal; and
   a filtering signal output unit configured to generate a filtering signal for filtering the data strobe signal in response to the plurality of filtering control signals and a plurality of burst length (BL) control signals.

2. The ringback circuit of claim 1, wherein the seed signal comprises a signal derived from a write command.

3. The ringback circuit of claim 1, wherein the plurality of BL control signals comprise a signal for controlling the BL to be four bits, a signal for controlling the BL to be 8 bits, and a signal for controlling the BL to be 10 bits.

4. The ringback circuit of claim 3, wherein the signal for controlling the BL to be 10 bits comprises a signal representing use of cyclic redundancy check (CRC).

5. The ringback circuit of claim 4, wherein the plurality of BL control signals are provided by a mode register set (MRS).

6. The ringback circuit of claim 3, wherein the filtering signal has a pulse width corresponding to the BL of four bits, 8 bits or 10 bits.

7. The ringback circuit of claim 1, wherein the seed signal is synchronized with a clock signal and the clock signal has a phase difference with the data strobe signal.

8. The ringback circuit of claim 7, further comprising a seed signal generation section configured to generate the seed signal in response to the write command and the clock signal.

9. A ringback circuit for a semiconductor memory device, comprising:
   a seed signal generation unit configured to generate a seed signal in a pre-amble period of a data strobe signal;
   a filtering control signal generation unit configured to receive the data strobe signal and synchronize the seed signal with the data strobe signal and sequentially generate filtering control signals;
   a filtering signal output unit configured to generate a filtering signal for filtering the data strobe signal in response to the filtering control signals and first and second burst length (BL) control signals; and
   a data strobe signal filtering unit configured to filter and output the filtered data strobe signal according to the filtering signal.

10. The ringback circuit of claim 9, wherein the seed signal comprises a signal synchronized with a clock signal.

11. The ringback circuit of claim 10, wherein, when the pre-amble period of the data strobe signal is one clock cycle of the data strobe signal, the seed signal generation unit is configured to activate the seed signal at a clock edge of the clock signal close to a half clock cycle point of the data strobe signal in the pre-amble period of the data strobe signal.

12. The ringback circuit of claim 10, wherein, when the pre-amble period of the data strobe signal is two clock cycles of the data strobe signal, the seed signal generation unit is configured to activate the seed signal at a clock edge of the clock signal close to a half clock cycle point of the data strobe signal in the pre-amble period of the data strobe signal.

13. The ringback circuit of claim 9, wherein the filtering control signal generation unit comprises:
a first D flip-flop configured to receive the seed signal and output a first filtering control signal in synchronization with a rising edge of the data strobe signal;
a second D flip-flop configured to receive the first filtering control signal and output a second filtering control signal in synchronization with a falling edge of the data strobe signal;
a third D flip-flop configured to receive the second filtering control signal and output a third filtering control signal in synchronization with a falling edge of the data strobe signal;
a fourth D flip-flop configured to receive the third filtering control signal and output a fourth filtering control signal in synchronization with a falling edge of the data strobe signal; and
a fifth D flip-flop configured to receive the fourth filtering control signal and output a fifth filtering control signal in synchronization with a falling edge of the data strobe signal.

14. The ringback circuit of claim 13, wherein the filtering signal output unit comprises:
a first activation signal generation section configured to generate a first activation signal according to the first to fourth filtering control signals and the first burst length control signal;
a second activation signal generation section configured to generate a second activation signal according to the fifth filtering control signal and the second burst length control signal; and
a filtering signal output section configured to output the filtering signal according to the first and second activation signals.

15. The ringback circuit of claim 14, wherein the first BL control signal comprises a signal for controlling a BL to be four bits or 8 bits and the second BL control signal comprises a signal for controlling the BL to be 10 bits.

16. The ringback circuit of claim 15, wherein the second BL control signal comprises a signal representing use of cyclic redundancy check (CRC).

17. The ringback circuit of claim 15, wherein the first and second BL control signals are provided by an MRS.

18. The ringback circuit of claim 9, wherein the filtering signal has a pulse width corresponding to the EL of four bits, 8 bits or 10 bits.

19. The ringback circuit of claim 9, wherein the seed signal generation unit is further configured to delay a write command and generate the delayed write command as the seed signal in synchronization with a clock signal and the clock signal has a phase difference with respect to the data strobe signal.

* * * * *